(12) United States Patent
Rockwell

(10) Patent No.: US 7,714,735 B2
(45) Date of Patent: May 11, 2010

(54) MONITORING ELECTRICAL ASSETS FOR FAULT AND EFFICIENCY CORRECTION

(76) Inventor: Daniel Rockwell, 270 Valley Rd., Media, PA (US) 19053

( * ) Notice: Subject to any disclaimer, the term of this patent is extended or adjusted under 35 U.S.C. 154(b) by 681 days.

(21) Appl. No.: 11/520,368

(22) Filed: Sep. 13, 2006

(65) Prior Publication Data

US 2007/0059986 A1    Mar. 15, 2007

Related U.S. Application Data

(60) Provisional application No. 60/716,413, filed on Sep. 13, 2005.

(51) Int. Cl.
    *G08B 21/00* (2006.01)
(52) U.S. Cl. .................. 340/635; 340/636.12; 340/638; 340/505; 340/506; 340/518; 702/64; 702/65; 702/126; 324/126; 324/142
(58) Field of Classification Search ................. 340/635, 340/636, 638, 505, 506, 518, 636.1; 702/64, 702/65, 126; 324/142, 126
    See application file for complete search history.

(56) References Cited

U.S. PATENT DOCUMENTS

| | | | | |
|---|---|---|---|---|
| 3,777,217 | A | * 12/1973 | Groce et al. | ................... 361/96 |
| 4,420,752 | A | * 12/1983 | Davis et al. | ............ 340/870.17 |
| 4,581,606 | A | *  4/1986 | Mallory | .................. 340/539.19 |
| 5,684,710 | A |  11/1997 | Ehlers | |
| 5,708,679 | A |  1/1998 | Fernandes | |
| 5,729,144 | A |  3/1998 | Cummins | |
| 5,995,911 | A | * 11/1999 | Hart | ............................. 702/64 |
| 6,005,759 | A |  12/1999 | Hart et al. | |
| 6,301,514 | B1 |  10/2001 | Canada | |
| 6,535,797 | B1 |  3/2003 | Bowles et al. | |
| 6,597,180 | B1 |  7/2003 | Takaoka et al. | |
| 6,751,562 | B1 |  6/2004 | Blackett et al. | |
| 6,940,702 | B2 |  9/2005 | Kojovic et al. | |

(Continued)

FOREIGN PATENT DOCUMENTS

EP        0026801        4/1981

(Continued)

OTHER PUBLICATIONS

Cooper Power Systems, S.T.A.R.™ Faulted Circuit Indicators, Bulletin No. 98025, Jun. 1998.

(Continued)

*Primary Examiner*—Tai T Nguyen
(74) *Attorney, Agent, or Firm*—RatnerPrestia

(57) ABSTRACT

A system and method of monitoring a plurality of electrical assets comprise an electricity distribution infrastructure, including a plurality of electrical asset sensors coupled to the electrical assets for monitoring an operating condition of the electrical assets as well as any fault conditions. The sensors may include a current transformer for obtaining a current waveform, a GPS receiver for applying a synchronized timestamp to the waveform data, and a mesh network radio for transmitting the time-stamped waveform data. Data from the plurality of sensors may be encrypted and transmitted over a mesh network to one or more gateways that are in communication with a central command processor. In response to an abnormal operating condition of any electrical asset, the central command processor may determine a probable fault location, a probable fault type, and a fault response.

11 Claims, 7 Drawing Sheets

U.S. PATENT DOCUMENTS

| | | | |
|---|---|---|---|
| 7,075,308 | B2 | 7/2006 | Rockwell |
| 7,135,580 | B2 * | 11/2006 | Bonrath et al. .............. 549/411 |
| 2002/0038199 | A1 | 3/2002 | Blemel |
| 2003/0161084 | A1 | 8/2003 | Potts et al. |
| 2003/0216876 | A1 | 11/2003 | Premerlani |
| 2005/0017751 | A1 | 1/2005 | Gunn et al. |
| 2005/0145018 | A1 | 7/2005 | Sabata |
| 2005/0151659 | A1 | 7/2005 | Donovan et al. |
| 2006/0056370 | A1 | 3/2006 | Hancock |
| 2006/0077918 | A1 | 4/2006 | Mao |
| 2006/0275532 | A1 | 12/2006 | Dechert |

FOREIGN PATENT DOCUMENTS

| | | |
|---|---|---|
| EP | 1505706 | 2/2005 |
| GB | 1501351 | 2/1978 |
| JP | 04-168914 | 6/1992 |
| JP | 06-102308 | 4/1994 |
| JP | 10-054863 | 2/1998 |
| WO | WO 0109628 | 2/2001 |
| WO | WO 00/60367 | 10/2002 |
| WO | WO 2004/068151 A1 | 8/2004 |
| WO | WO 2005/019846 | 3/2005 |
| WO | WO 2005/067686 | 7/2005 |
| WO | WO 2005/091958 | 10/2005 |
| WO | WO 2006/031739 | 3/2006 |

OTHER PUBLICATIONS

P. Doig et al., Reclassification of Relay-Class Current Transformers for Revenue Metering Applications, © 2005 IEEE Reprinted from the proceeding of the IEEE T&D PES Conference, pp. 1-8.

U.S. Climate Change Technology Program—Technology Options for the Near and Long Term, Aug. 2005—pp. 1.3-12, http://www.climatetechnology.gov/library/2005/tech-options/tor2005-135.pdf.

E. V. Solodovnik, G. Yang, M. Ali, and R.A. Dougal, Wireless Sensing and Controls for Survivable AC Zonal System, 2004, http://www.actapress.com/PaperInfo.aspx?PaperID=17901.

A. Risley, J. Roberts, Electronic Security Risks Associated With Use of Wireless, Point-To-Point Communications in the Electric Power Industry, 2003, pp. 1-16, http://www.selinc.com/techpprs/6144.pdf.

A. Hacker, A. Somani, Securing America's Power Grid, Iowa State University News Service Relations, 2006, http://www.iastate.edu/~nscentral//news/2006/jun/grid.shtml.

ABB Improves Grid Reliability in Algeria, Jun. 13, 2006, http://www.abb.com/cawp/seitp202/d18e8cf73169fbc125714900427925.aspx?.

M. Nordman, An Architecture for Wireless Sensors in Distributed Management of Electrical Distribution Systems, http://lib.tkk.fi/Diss/2004/isbn9512272989.pdf.

K. Ozaki, K. Watanabe, S. Itaya, N. Hayashibara, T. Enokido, M. Takizawa, A Fault-Tolerant Model for Wireless Sensor-Actor System, IEEE Computer Society, Proceedings of $20^{th}$ International Conference on Advance Information Networking and Applications, p. 5, 2006.

M. M. Nordman, T. Korhonen, Design of a Concept and a Wireless ASIC Sensor for Locating Earth Faults in Unearthed Electrical Distribution Networks, IEEE Transactions on Power Delivery, vol. 21, No. 3, pp. 1074-1082, Jul. 2006.

K. Sun, P. Ning, C. Wang, Fault-Tolerant Cluster-Wise Clock Synchronization for Wireless Sensor Networks, IEEE Transactions on Dependable and Secure Computing, pp. 177-189, vol. 2, No. 3, Jul.-Sep. 2005.

M. Govindarasau, M.V. Salapaka, A. K. Somani, Z. Wang, SST—Sensor Network Design for a Secure National Electric Energy Infrastructure, Iowa State University, Department of Electrical Engineering, 2004, http://www.eng.iastate,edu/abstracts/vieewabstract.asp?id=1920.

* cited by examiner

MONITORING ELECTRICAL ASSETS FOR FAULT AND EFFICIENCY CORRECTION

This Application claims benefit of priority from U.S. Provisional Application No. 60/716,413 filed Sep. 13, 2005, the contents of which are incorporated herein by reference.

TECHNICAL FIELD

The present invention relates generally to monitoring an electrical infrastructure and, more particularly, to locating and identifying disturbances and determining status of electrical assets in an electrical infrastructure.

BACKGROUND OF THE INVENTION

Based, in part, on the recent deregulation of the electrical supply market, increased competition amongst electricity providers has prompted the need for increased efficiency in electricity distribution as well as increased quality of service. In the event of a fault condition, for example, there is a need for rapid determination of the fault location and fault type so that work crews may be dispatched for rapid response to a fault or outage. Within dense urban areas, in particular, there is a need for precise power distribution asset monitoring due to the sheer number of electrical assets (e.g., power lines, transformers, etc.) that may be the cause or location of a fault condition, and the concomitant difficulty in pin-pointing the location of such a fault condition. Generally, fault conditions may arise from such events as lightning strikes, fallen trees, blown transformers, and strong winds, for example.

Aside from determining fault locations for rapid-response by work crews, there is also a need to improve the efficiency of electricity distribution. This may be done by power factor correction and load monitoring, for example. In order to achieve desirable levels of efficiency (e.g., 99% power factor correction), however, utilities require accurate monitoring of electrical assets in their electricity distribution infrastructure.

Electrical utilities are responsible for management and control of the electricity distribution assets and, thus, monitor these assets and coordinate field personnel in a variety of maintenance and fault-response activities via a central command center. Many such central command centers isolate outage or fault locations based on customer complaints and reports of outages. Some utilities also implement sensors for monitoring electrical assets and reporting faults and/or outages. These existing monitoring systems, however, are unable to pin-point the source of a fault, identify the probable cause of the fault, or identify the chain of events leading to the fault.

A further problem faced by the utilities includes theft and inaccuracy in existing electricity meters, whereby customers are either consistently under-billed or over-billed due to inaccurate usage metering. Currently, this problem may be addressed by implementing one or more sensors on power lines leading to a customer, whereby the sensor readings are compared to electric meter readings. This presents an additional cost to utilities, however, as they incur overhead associated with hiring workers to drive around and collect meter and sensor readings, making such an implementation undesirably cost-prohibitive.

SUMMARY OF THE INVENTION

The present invention is embodied in an apparatus for monitoring an electrical asset in an electrical infrastructure. The apparatus may include a sensor coupled to the electrical asset for obtaining data corresponding to at least one of a voltage, current, and phase angle waveforms, a globally synchronized timer for time-stamping the data with a globally synchronized time, a mesh network radio for communicating at least one gateway and for relaying communications between one or more other electrical asset monitors and the at least one gateway, and a power supply for extracting and storing energy from the electrical asset and supplying power to at least the sensor, the timer, and the radio.

In a further embodiment, such an apparatus may be used in a system for monitoring a plurality of electrical assets that define an electrical infrastructure. The system may include electrical asset monitors coupled to the electrical assets, one or more gateways having mesh network radios for communicating with the electrical asset monitors and a network interface for communicating with a central command center via a network distinct from the mesh network, and a central command center. The central command center may include a network interface for communicating with the one or more gateways, a memory for storing a database of fault signatures, a second memory for storing the sensed data, and a processor for analyzing the sensed data to identify a probable fault type, a probable fault location, and a fault response. In the further embodiment, the system further includes a mesh network for routing communications among the electrical asset monitors and the one or more gateways, whereby the mesh network coordinates efficient communication paths among the plurality of electrical asset monitors and the one or more gateways.

In an alternate embodiment of the present invention, a method of monitoring an electrical asset in an electrical infrastructure may include sensing, by a monitoring element, one or more of a current, voltage, and phase angle waveforms of an electrical asset, digitizing the sensed waveforms into a digital signal, encrypting the digital signal. The encrypted, digital signal may then be transmitted through a mesh network, where it is routed to a gateway based on a most efficient path between the monitoring element and the gateway. The method may further include relaying, to a gateway, one or more other encrypted digital signals from other monitoring elements.

In a further alternate embodiment, a method of managing electrical assets that define an electrical infrastructure may be performed by receiving, from one or more gateways, encrypted data collected by a plurality of electrical asset sensors, decrypting the encrypted data to obtain a plurality of sensed waveforms, wherein each one of the sensed waveforms is synchronized according to a globally synchronized timer and includes a plurality of coordinates identifying a source location of the waveform, and determining, based on the plurality of sensed waveforms and respective source locations, one or more of an abnormal condition and a normal condition.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention is embodied in an apparatus, system, and method of monitoring a plurality of electrical assets that comprise an electricity distribution infrastructure. The electric assets being monitored may include power lines, cables, circuit breakers, switches, and transformers, for example. Monitoring activities are overseen by a central command center that obtains sensor data from multiple gateways. Each gateway collects data from a plurality of remotely located sensors that are coupled to respective ones of the electrical assets for obtaining data on the operating condition of the electrical assets. Data from any given sensor is routed to a gateway via a mesh network, where the data is multi-hopped from sensor-to-sensor according to an efficient communication path to the gateway. The gateway then re-routes the data from the mesh network, which is a tier-2 network, to the central command center via a tier-1 network (e.g., radio link, fiber optic link, the Internet, a leased common-carrier link, etc.). Based on the aggregate data from the multiple sensors, the central command center may monitor the electrical assets to identify normal operating conditions, abnormal operating conditions, faults, probable fault types, probable fault locations, electric metering errors, and power system inefficiencies (e.g., for power factor correction), for example.

Figure 1:
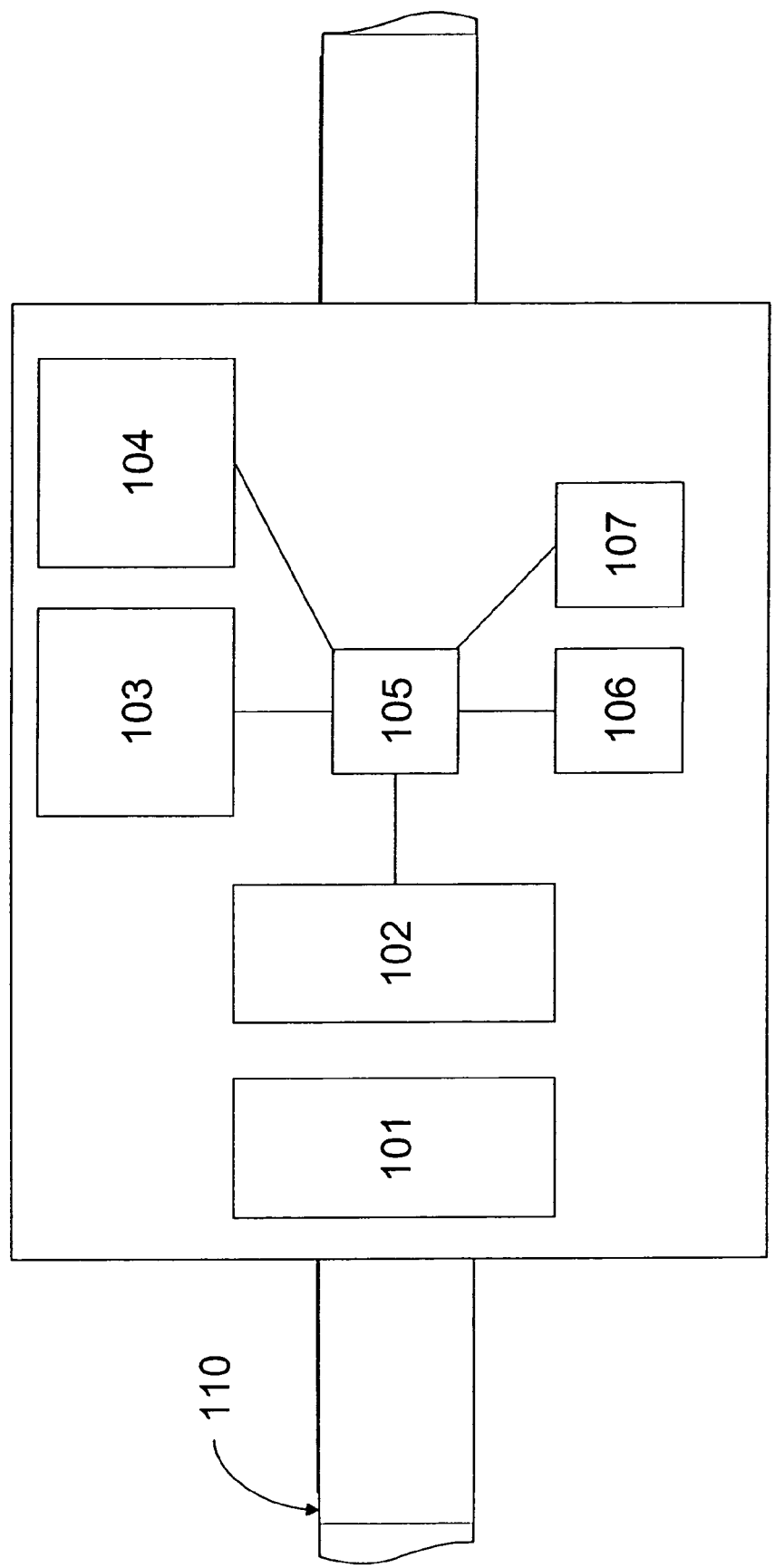
FIG. 1 is a block diagram illustrating an electrical asset monitoring device coupled to an electric power line, according to one embodiment of the present invention.

Referring now to the drawing, in which like reference numbers refer to like elements throughout the various figures that comprise the drawing, FIG. 1 is a block diagram illustrating one embodiment of the present invention. Electrical asset monitoring device 100 is shown as being coupled to an exemplary electrical asset (e.g., a power line) 110, via a mechanical clamping mechanism or any other means known to those of ordinary skill in the art. Electrical asset monitoring device 100 includes a power supply 101 for extracting and storing energy from the electrical asset 110 in order to supply operating power to device 100. Power supply 101 may be coupled to electrical asset 110 via a direct electrical coupling, an inductive coupling, a capacitive coupling, or by any other means known to those of ordinary skill in the art. Power supply 101 is also electrically coupled (not shown in FIG. 1) to components 102-107 of monitoring device 100.

Sensor 102 obtains data corresponding to operating conditions of electrical asset 110. The data obtained by sensor 102 may comprise a voltage waveform, a current waveform, or a phase signal of electricity being transmitting by electrical asset 110. Alternately, sensor 102 may obtain data corresponding to a current waveform, a separate sensor (not shown in FIG. 1) may obtain data corresponding to a voltage waveform, and on-board processor 105 may calculate the phase waveform. The phase waveform may be a phase difference between the voltage and current waveforms over time, for example. Alternately, the phase waveform calculation may be performed by an off-board central processor (not shown in FIG. 1). Other measurements that may be gathered by sensor 102 include a temperature and/or frequency of electrical asset 100. Sensor 102 may be either an analog or a digital sensor. If sensor 102 is an analog sensor, however, either processor 105 or a separate analog-to-digital converter (not shown in FIG. 1) may digitize the analog data from sensor 102.

It may also be desirable to ensure that voltage and/or current waveforms are synchronized to data being collected by other monitoring devices (not shown in FIG. 1) for other electrical assets (not shown in FIG. 1). Accordingly, globally synchronized timer 104 is provided to obtain a timing signal that is synchronized with the other monitoring devices. Globally synchronized timer 104 may include a global positioning system (GPS) receiver that receives a globally synchronized time as well as a local timer that is tuned to the GPS timing signal. Accordingly, in the event that the GPS receiver is not able to find a GPS signal, the local timer is able to provide a substantially synchronized timing signal until it is able to re-synchronize with the GPS signal. The GPS receiver of globally synchronized timer 104 may also be used to obtain a plurality of coordinates corresponding to the location of monitoring device 100.

Data obtained by sensor 102, therefore, may be time-stamped by on-board processor 105 with the timing signal obtained from globally synchronized timer 104 (i.e., either from a GPS receiver or a local timer synched to the GPS receiver). The time-stamped data may then be transmitted to a gateway (not shown in FIG. 1) from monitoring device 100 via mesh network radio 103. Mesh network radio 103 may also receive communications from other monitoring devices (not shown in FIG. 1) requesting that their respective data be relayed to a gateway (not shown in FIG. 1). Accordingly, mesh network radio 103 relays such communications according to efficient communication paths.

Mesh network radio 103 may be configured to operate using a Zigbee protocol, a Wi-Fi protocol, Wi-Max protocol or any other mesh network configuration capable of self-configuration and dynamic load-balancing, whereby efficient communication paths among network participants (i.e., monitoring devices and gateways) are automatically determined among the participants. Alternately, static, predetermined communication paths may be obtained and programmed into mesh network radio 103, whereby mesh network 103 relays communications according to the predetermined paths. Further, if a Zigbee protocol is being used, it may be desirable to boost the output power of mesh network radio 103 to 1 watt (i.e., both receiver and transmitter), thereby increasing the communications range of monitoring device 100. In addition, the data transmitted by the radio 103 may include an error correction code (ECC) to make the transmission more robust. Monitoring device 100 may also include memory 107 for storing the time-stamped data, if desired.

In a further embodiment, processor 105 may detect an abnormal operating condition of electrical asset 110 based on the data collected by sensor 102. This may be done, for example, by comparing sensed data with either a predetermined threshold, or an operating point, which may be a moving average of the sensed data. Accordingly, mesh network radio 103 may be configured to transmit sensed data only when an abnormal operating condition is detected by processor 105. Alternately, sensed data corresponding to all conditions of electrical asset 110—including both abnormal and normal conditions—may be transmitted by mesh network radio 103.

In yet another embodiment, monitoring device 100 may include memory 106 for storing a plurality of fault signatures corresponding to a number of different fault types (e.g., lightning strike, downed wire, line-to-line fault, etc.). Fault signatures stored by memory 106 may be any number of exemplary fault signals developed to mimic real fault conditions and are available for licensing from various institutions, such as Texas A&M University, for example. According to the present embodiment of the invention, on-board processor 105 may correlate data corresponding to an abnormal condition of electrical asset 110 to the plurality of fault signatures stored by memory 106. Based on the correlation, processor 105 may be able to identify a probable fault type corresponding to the abnormal condition. Accordingly, the fault type identifying the abnormal condition, the time-stamped data corresponding to the abnormal condition, and the plurality of GPS coordinates corresponding to the location of monitoring device 100 (which, in one embodiment of the invention, may be considered to be a probable fault location) may be transmitted by mesh network radio 103.

In an additional embodiment, any number of encryption schemes known to those of ordinary skill in the art may be implemented for encrypting communications to and/or from mesh network radio 103. For example, encryption may be performed according to the advanced encryption standard (AES), the data encryption standard (DES), Triple DES, Blowfish, or Twofish algorithms, where the encryption key may be obtained via tree-group Diffie-Hellman (TGDH), the RSA protocol, or an elliptic-curve cryptography protocol. Accordingly, processor 105 may encrypt data that is transmitted by mesh network radio 103, including the fault location, the fault type, and time-stamped data corresponding to the fault. In an embodiment where data corresponding to normal operating conditions are also transmitted, data corresponding to normal conditions may also be encrypted according to a desirable encryption scheme prior to being transmitted by mesh network radio 103.

Figure 2:
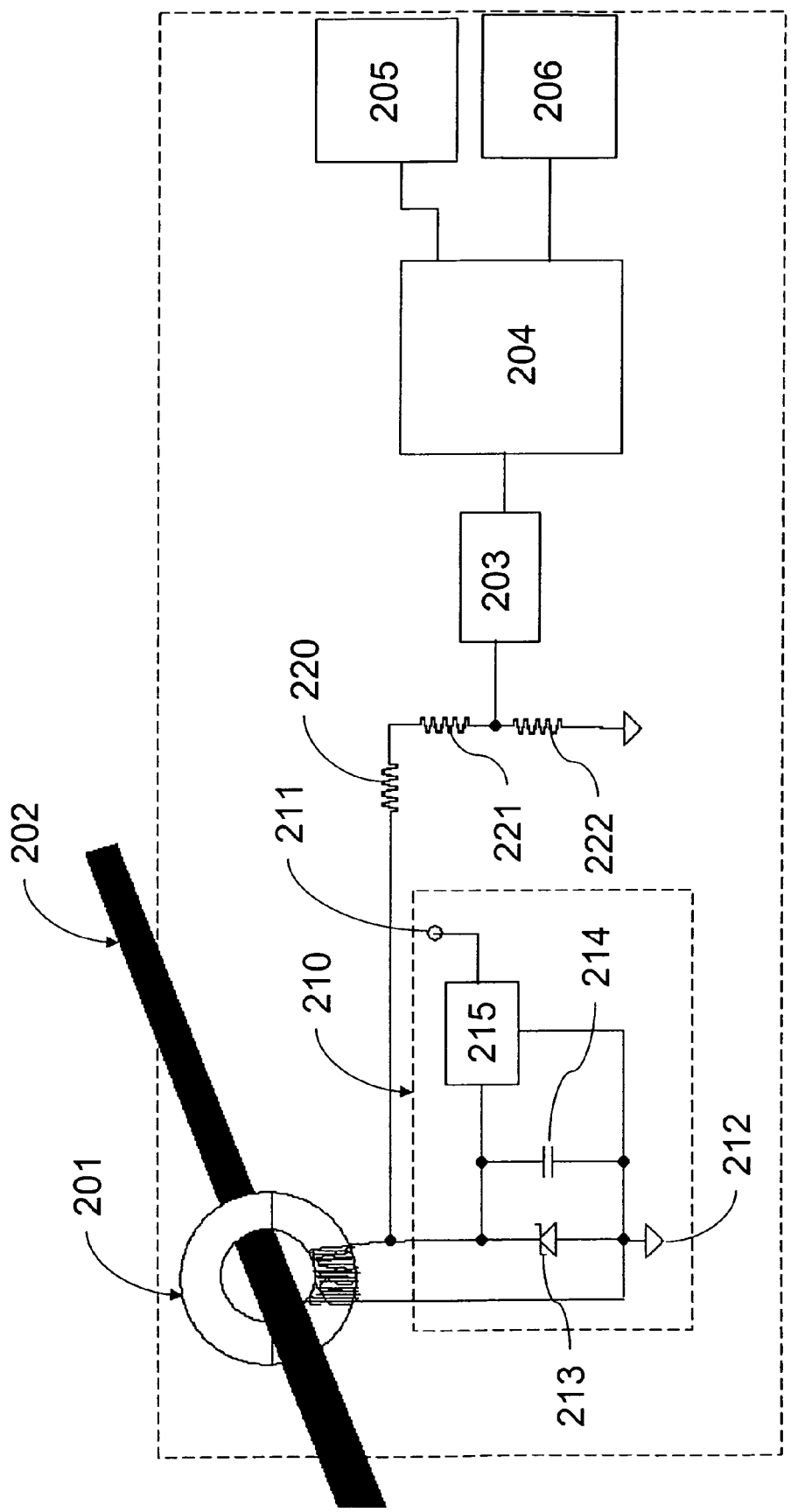
FIG. 2 is an exemplary diagram of an electrical asset monitoring device coupled to an electric power line, further illustrating exemplary circuit components of the electrical asset monitoring device, according to an alternate embodiment of the present invention.

According to a further embodiment of the invention, FIG. 2 illustrates an exemplary monitoring device 200 that may be coupled to power line 202. Exemplary monitoring device 200 includes current transformer 201 inductively coupled to power line 202 for providing a stepped-down current signal for current sensing and/or providing operating power. Current transformer 201 steps down the current supplied by electrical asset 202 by a predetermined ratio to provide a current signal that is within an operating range of analog-to-digital converter 203. Before reaching analog-to-digital converter 203, the current signal may also be filtered by a conditioning circuit (e.g. a low-pass filter) (not shown in FIG. 2) to remove high frequency noise from the current signal. Resistors 220, 221, and 222 comprise a voltage divider for providing a desirably scaled signal to analog-to-digital converter 203. Power supply 210 (shown in phantom) includes high potential node 211 (for providing an operating voltage, e.g. Vcc), common potential node 212 (for providing a reference potential, e.g. ground), voltage regulator 215 (to maintain a constant operating voltage), energy storage capacitor 214 (for providing operating power in the case of an outage on the electrical asset being monitored), and Zener diode 213 (for voltage regulation and transient protection across capacitor 214). As shown in FIG. 2, current transformer 201 is a split-core transformer coupled, inductively, to power line 202. Those skilled in the art will recognize that any other current transformers may be used, such as a closed-core current transformer, for example. Alternative embodiments of the invention may use a potential transformer, a Hall effect sensor, a Rogowski coil, or an optoelectronic sensor including, for example, a Kerr cell, a Pockels cell and/or a Faraday-effect sensor for sensing voltage and/or current waveforms of electric power line 202. The exemplary monitoring device 200 may include protection circuitry, in addition to the Zener diode 213, to shield the device 200 from transient voltage and current spikes which may occur, for example, during a lightning strike.

Digitized data from analog-to-digital converter 203 is time-stamped by processor 204 with a timing signal provided by timing module 206. Timing module 206 may include a local timer synched to a timing signal provided by a GPS receiver, as described above. This GPS receiver may also provide coordinates identifying the location of monitoring device 200. Alternatively or in addition, the device 200 may have an identifier by which its position is known to the central command center and this identifier may be transmitted to the command center. If both the identifier and the GPS coordinates are sent, the command center may be able to determine if the device 200 has moved from its assigned location. Processor 204 may perform other functions, such as encrypting the time-stamped data, for example. In one embodiment of the invention, processor 204 may be a digital signal processor (DSP), capable of sampling data from sensor 201 128 times per 60 Hz power cycle, for example. Processor 204 may also detect an abnormal condition of power line 202 by comparing the time-stamped data to an operating point of power line 202, which may be a moving average of sensed data or a predetermined threshold, for example. Processor 204 is also coupled to a non-volatile memory (not shown) which stores the digitized and time-stamped data. If, due to a loss of power, this data cannot be transmitted proximate in time to the occurrence of the fault, it may be stored in the non-volatile memory and transmitted when power is restored.

Digitized, time-stamped data from processor 204 may then be transmitted by mesh network radio 205. If provided, GPS coordinates and/or an identifier, identifying the location of monitoring device 200 may also be included with mesh network radio 205 transmissions. Mesh network radio 205 is configured to transmit and relay messages to one or more gateways according to dynamically calculated efficient communication paths, and may be a Zigbee radio, a Wi-Max radio or a Wi-Fi radio. If radio 205 is a Wi-Fi radio, it may be programmed to operate in ad-hoc mode, where the efficient communication paths are coordinated by an ad-hoc on-demand distance vector (AODV) algorithm.

Figure 3:
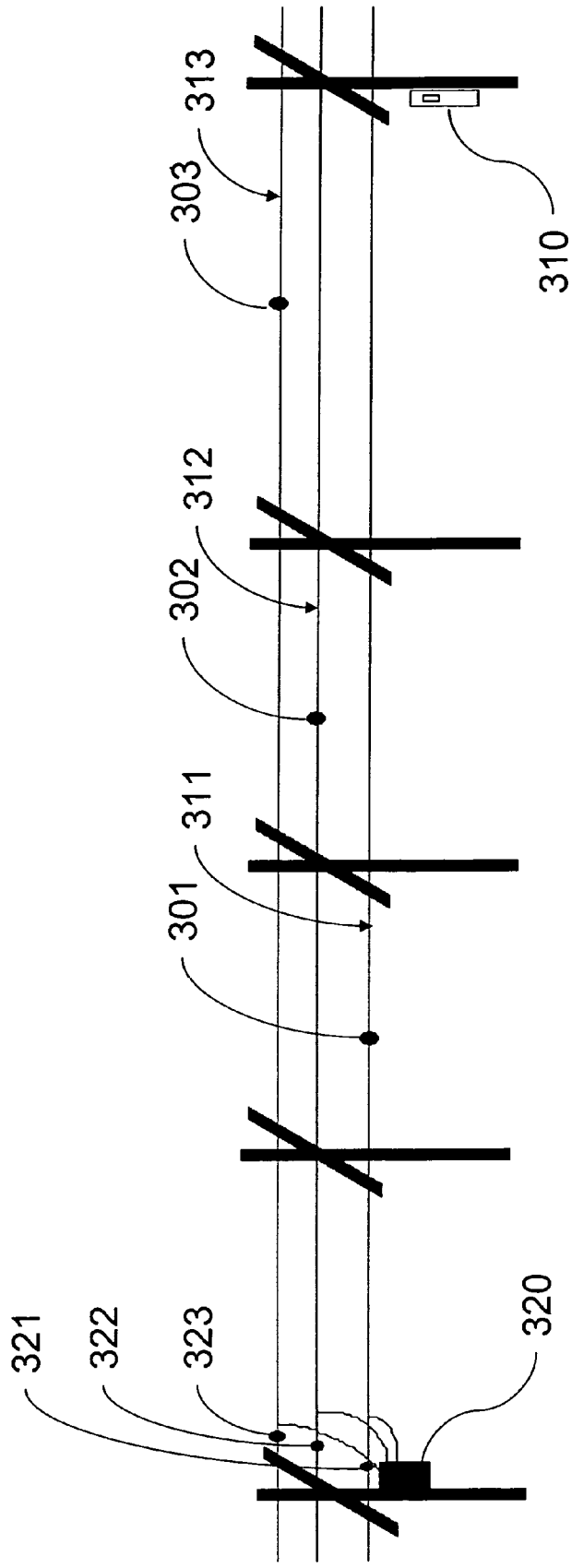
FIG. 3 is an exemplary diagram of a plurality of electrical asset monitoring devices coupled to electric power lines for monitoring the power lines and transmitting information to a gateway, according to one embodiment of the present invention.

FIG. 3 illustrates an electrical infrastructure monitoring system in which exemplary electrical asset monitors 301, 302, and 303, such as the monitoring devices described above, may be implemented for monitoring electric lines 311, 312, and 313, respectively, in electricity distribution infrastructure 300. Electrical asset monitors 321, 322, and 323 may be used for monitoring electric asset 320. Monitors 301-303 and 321-323 are coupled to electric lines 311-313 and electric asset 320, respectively, and each includes a sensor for obtaining voltage, current, and/or phase waveforms from the electric line. Each of monitors 301-303 and 321-323 also includes a mesh network radio for transmitting and relaying communications to gateway 310, a globally synchronized timer for time-stamping data obtained by the sensor, and a power supply coupled to the electric line for obtaining operating energy from the electric line. Monitors 301-303 and 321-323 may also include a power storage device for at least temporarily providing operating power in the event of a power outage.

In one embodiment of the invention, gateway 310 is one of a plurality of gateways configured to receive communications from a plurality of monitoring devices including, among others (not shown in FIG. 3), monitors 301-303 and 321-323. Accordingly, gateway 310 may include a mesh network radio for receiving communications via a mesh network in which the plurality of monitoring devices and gateways may be participants. Gateway 310 may also include a network interface for relaying communications received from the monitoring devices via the mesh network to a central command center via a network distinct from the mesh network.

In one embodiment of the invention, gateway 310 may receive communications from monitors 301-303 and 321-323 via the mesh network and re-transmit those communications via the network interface, which may be, for example, a modem configured for communication with the central command center over a global information network (e.g. the Internet). In an alternate embodiment, the network interface may be a modem configured to broadcast the communication over an existing radio channel used by an electric utility company in charge of electricity distribution infrastructure 300. In another alternate embodiment, the network interface may be a light-emitting diode or a laser for communicating over an optical fiber. In yet another alternate embodiment, the network interface may be a modem configured for communication across a leased common-carrier link.

In a further embodiment of the invention, communications from monitors 301-303 and 321-323 may be encrypted according to an encryption scheme, which may include AES, DES, triple DES, Blowfish, or Twofish for encrypting communications using a private key obtained via TGDH, an RSA protocol, or an elliptic-curve cryptography protocol, for example. Accordingly, monitors 301-303 and 321-323 may include a processor configured to implement the encryption scheme and encrypt communications to gateway 310. Gateway 310 may also include a processor configured to implement the encryption scheme and decrypt communications from monitors 301-303 and 321-323. Gateway 310 may also be configured to implement a second encryption scheme for encrypting communications to the central command center. The second encryption scheme may either be the same as or different from the first encryption scheme. In the present embodiment, the central command center (not shown in FIG. 3) is configured to implement the second encryption scheme for decrypting communications from gateway 310 and any other gateways in the system (not shown in FIG. 3).

The central command center (not shown in FIG. 3) is operated by an electric utility company, or any other entity that manages and monitors the electricity distribution infrastructure, and may include a network interface for communicating with gateway 310 and the other gateways in the system. The command center also includes a memory for storing a database of fault signatures, a second memory for storing sensor data originating from monitors 301-303, 321-323, and any other monitoring devices in the system, and a processor for analyzing the sensor data in order to identify a fault, a probable fault type, a probable fault location, and a fault response.

The central command center may identify a fault by comparing sensor data for electrical assets being monitored to expected operating point(s) for those electrical assets. Accordingly, if the sensor data indicates that an electrical asset is operating at a certain percentage above or below the operating point, then the central command center may determine that the electrical asset has a fault. The operating point for each electrical asset may be obtained, for example, by taking a moving average of sensor data for the electrical asset when it is operating in a normal condition. If a fault is identified at any of the electrical assets, the probable fault type of the fault may be determined by correlating the sensor data to a number of fault signatures in the database of fault signatures. The fault signatures correspond to a number of different fault types (e.g., lightning strike, downed wire, line-to-line fault, etc.), and are exemplary fault signals developed to mimic real fault conditions. Databases of fault signatures may be available for licensing from various institutions, such as Texas A&M University, for example.

If multiple monitoring devices located physically close to one another (e.g., within a 1 mile radius) all transmit sensor data identifying a fault, then an assumption may be made that the monitoring devices have identified the same fault. Accordingly, sensor data from each of monitoring devices may be correlated to the fault signatures in order to identify the probable fault type. Alternately, a weighted average of correlation values may be calculated, with the fault signature correlation value for a monitoring device that detected the fault first being given a highest weight and the fault signature correlation value for a monitoring device that detected the fault last being given a lowest weight.

For example, five monitoring devices, M1-M5, may detect the fault, with M1 detecting the fault first, M2 detecting the fault second, M3 detecting the fault third, M4 detecting the fault fourth, and M5 detecting the fault last. Accordingly, for any given fault signature in the fault database, correlation values $C_1$-$C_5$ are obtained by correlating sensor data from each of M1-M5, respectively. A final correlation value, $C_{final}$, for the detected fault may be obtained, therefore, by obtaining a weighted average of $C_1$-$C_5$ based on the sequence in which M1-M5 detected the fault. The final correlation value is obtained according to any predetermined weighting scheme, which, for the present example, may be:

$$C_{final} = \frac{w_1 \cdot C_1 + w_2 \cdot C_2 + w_3 \cdot C_3 + w_4 \cdot C_4 + w_5 \cdot C_5}{w_1 + w_2 + w_3 + w_4 + w_5},$$

where $w_1$-$w_5$ are the predetermined weighting values. A fault type corresponding to the fault signature with the highest final correlation value may be designated as the probable fault type.

Figure 4:
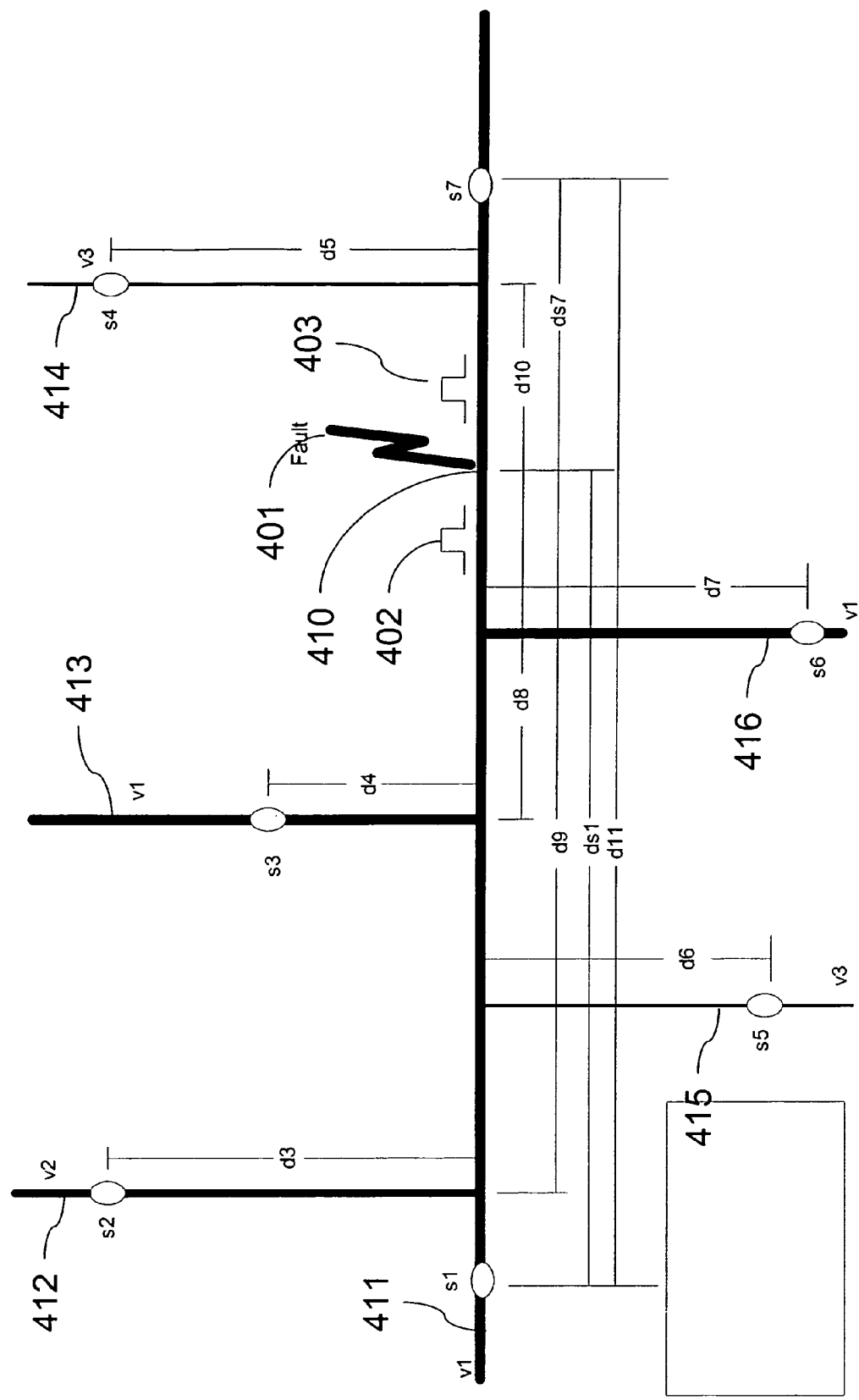
FIG. 4 is a schematic diagram illustrating a plurality of electrical asset monitoring devices on a power line for use in describing an exemplary process of fault location.

The central processor may also analyze data from the monitors in order to identify the probable fault location. FIG. 4 illustrates an exemplary electricity distribution infrastructure 400 employing monitors s1-s7 for monitoring electrical lines 411-416. Each of electrical lines 411-416 may have differing characteristics, including, for example, a propagation velocity. Accordingly, the central command center may also include a memory for storing a database of electrical asset (i.e., electrical lines in the present embodiment) characteristics including, for example, propagation velocities. In the present exemplary infrastructure 400, therefore, electrical lines 411, 413, and 416 may have propagation velocity v1, line 412 may have propagation velocity v2, and lines 414 and 415 may have propagation velocity v3. An abnormal condition on at least line 411 may arise at time, t0, due to fault 401 at fault location 410. Fault 401 also causes fault waveforms 402 and 403, with fault waveform 402 traveling toward monitor s1 and fault waveform 403 traveling toward monitor s7. Monitor s7 detects fault waveform 403 at time t7 and monitor s1 detects fault waveform 402 at time t1.

Accordingly, monitors s1 and s7 sense and record data corresponding to fault waveforms 402 and 403, respectively. The data corresponding to fault waveforms 402 and 403 are also time-stamped with times t0 and t7, respectively, where times t1 and t7 are obtained according to a globally synchronized timer. The globally synchronized timer may obtain the globally synchronized time from a GPS receiver, for example, where there may be desirably negligible timing error between monitors s1-s7. For example, at time, t0, sensor s1 time-stamps sensed data with t1 and not with some erroneous time, t1+error1. A GPS receiver may also be able to provide monitors s1-s7 with GPS coordinates identifying a global location of sensors s1-s7. Monitors s1 and s7 may transmit, to the central command center, the time-stamped data corresponding to fault waveforms 402 and 403, as well as the GPS coordinates that identify their respective global locations.

The central command center may then determine a probable location of fault 401 by analyzing the data to determine the distance ds7 of fault location 410 from monitor s7, and distance ds1 of fault location 410 from monitor s1. The central command center may then perform the following exemplary calculation procedure to identify the probable fault location.

The procedure begins by setting ds1=v1·(t1−t0), where ds1 is an unknown distance between monitor s1 and fault location 410, v1 is a known propagation velocity of line 411, t0 is a known time at which fault waveform 402 is detected, and t0 is an unknown time at which fault 401 occurs. Solving for t0, above, t0=t1−ds1/v1. Similarly, ds7=v1·(t7−t0), where ds7 is an unknown distance between monitor s7 and fault location 410, v1 is a known propagation velocity of line 411, t7 is a known time at which fault waveform 403 is detected, and to is an unknown time at which fault 401 occurs. The distance between monitors s1 and s7, d11, may be stored in a database, or may be calculated according to the GPS coordinates identifying the global position of monitors s1 and s7. It is also known that d11=ds1+ds7. The equations obtained, above, may be substituted for ds1 and ds7 to obtain: d11=v1·(t1−t0)+v1·(t7−t0), which simplifies to d11=v1·(t1+t7−2·t0). Substituting for t0, d11=v1·(t1+t7−2·(t1−ds1/v1)), which simplifies to d11=v1·t7−v1·t1+2·ds1, where d11, v1, t7, and t1 are known values. Accordingly, the central command center may solve for ds1 and ds7, thereby identifying the probable fault location. Those of ordinary skill in the art will be able to perform similar calculations to identify probable fault locations for faults originating on any of lines 411-416.

A fault response may be assigned and initiated once the central command center has identified identify a fault, a probable fault type, and a probable fault location. In one embodiment, the fault response may be a warning that includes the probable fault location and the probable fault type. The fault warning may be, for example, a fax message, an e-mail message, a pager message, an audiovisual warning, a network alert, an SMS message, and/or a Simple Object Access Protocol (SOAP) message. If an unbalanced power factor is detected, the central command center may initiate a power factor correction algorithm, which may include, for example, switching on any number of capacitor banks, or any other power factor correction method known by those of ordinary skill in the art. If an electrical asset failure (e.g., blown transformer, downed wire, etc.) is detected, then the fault response may be to initiate an electrical asset isolation algorithm. Such an algorithm may switch the faulted electrical asset out of the electricity distribution infrastructure, thereby preventing the possible spread of the fault condition to other electrical assets. If an electrical asset overload is detected, then the fault response may be to initiate an electrical asset bypass algorithm. Such an algorithm may direct electricity distribution around the overloaded asset, or switch in additional electrical assets into the electricity distribution infrastructure, thereby preventing a fault from occurring at the overloaded asset. Alternately, the electrical asset bypass algorithm may control the source of the overloading in order to reduce the load on the electrical asset. For example, if the source of overloading includes an air conditioning system of a large office building, then the algorithm may have control over the thermostat of the large office building in order to reduce the load in peak conditions.

Referring, again, to FIG. 3, monitors 321-323 may be used to monitor electricity consumption of substation 320, which may be a residential distribution station, for example. In one embodiment, substation 320 may include one or more electric meters for logging electricity consumption. According to the prior art, electric utility personnel drive to, and manually interrogate the electric meters in order to obtain the logged electricity consumption data. In order to eliminate the need for manual interrogation of the electric meters, one embodiment of the present invention includes electric meters that are configured to transmit the logged electricity consumption data to the central command center via the mesh network. Electric meters in the present embodiment may include a mesh network radio for communicating via the mesh network and a globally synchronized timer for time-stamping the consumption data. Accordingly, the central command center may receive time-stamped observed consumption data from the electric meters as well as time-stamped actual consumption data from monitors 321-323. The command center may then compare the observed and actual consumption values over time in order to determine whether an error exists at any of the electric meters. A theft monitor may be alerted, when the magnitude of any such error exceeds some predetermined threshold. For example, if an electric meter indicates that consumption is some percentage below an actual consumption value (e.g., 50% of actual consumption), then an assumption may be made that someone has altered the electric meter in order to steal electricity. Accordingly, the theft monitor may assign an investigator to investigate the assumed theft, generate a bill based on the actual consumption value, or assign a repair crew to repair the electric timer.

Figure 5:
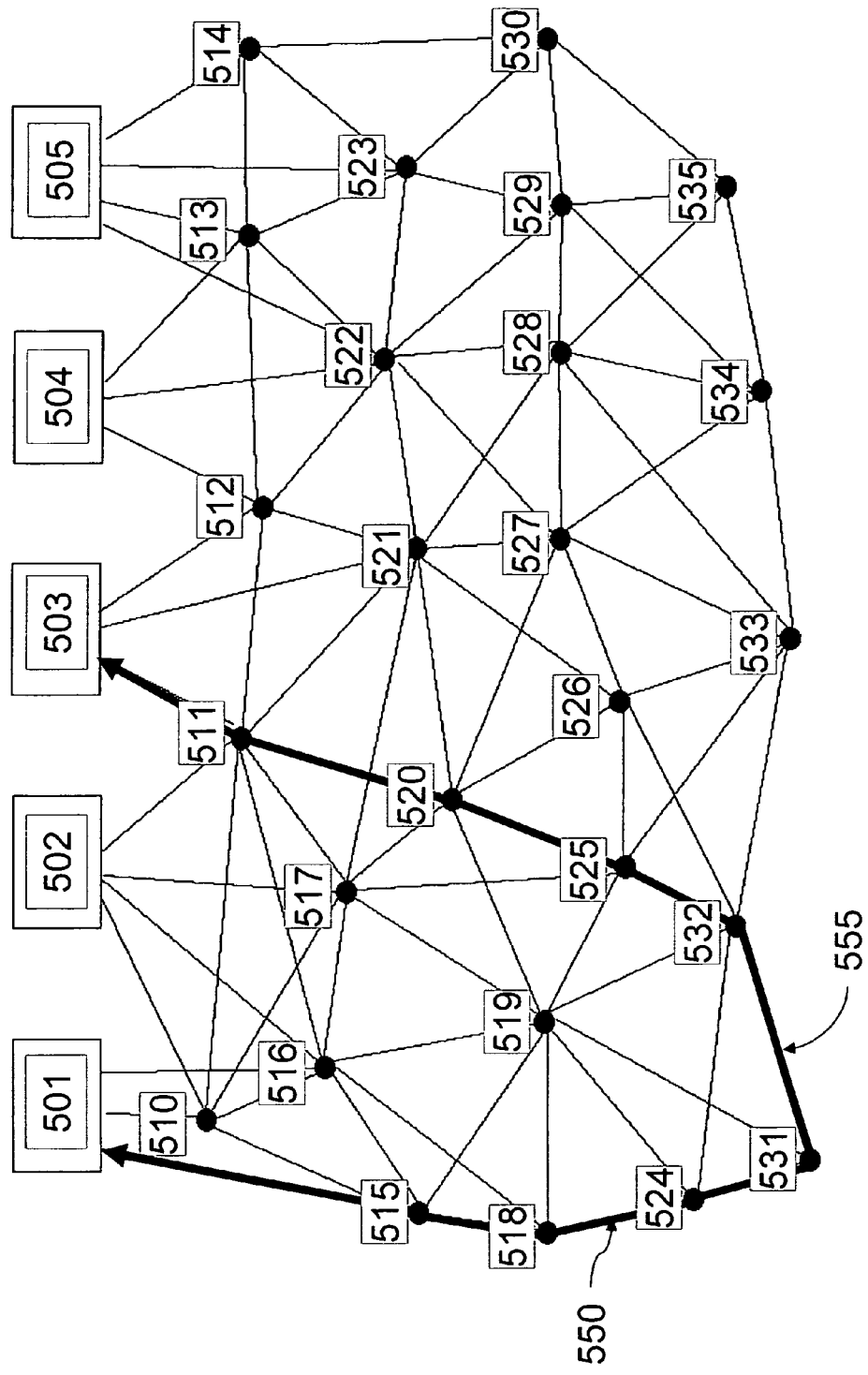
FIG. 5 is a schematic diagram of an exemplary mesh network for monitoring a plurality of electrical assets, according to the present invention.

FIG. 5 illustrates an exemplary mesh network 500 formed according to one embodiment of the present invention and including gateways 501-505 and electric asset monitors 510-535. A plurality of direct communication links are shown as formed between monitors and between certain monitors and gateways. The mesh network coordinates efficient communication paths among the electrical asset monitors and the one or more gateways. For example, electrical asset monitor 531 may transmit data to gateway 501 according to efficient path 550, whereby communications are routed through electrical asset monitor 524 to monitor 518, monitor 518 to monitor 515, and monitor 515 to gateway 501. In the event of a failure of one or more of the monitors, however, the most efficient path to a gateway may not necessarily be the shortest path. The mesh network, therefore, dynamically determines efficient paths. A failure of the monitors may arise from a power outage that results in one or more monitors dropping out of the network. Alternately, the failure may arise from one or more monitors being congested with network traffic, causing an undesirable slowing of communications to and from the congested monitors. In the event of a failure of monitor 518, monitor 515, and/or monitor 524, for example, monitor 531 may transmit data according to alternate efficient path 555. Alternate efficient path 555 may route data from monitor 531 through monitor 532 to monitor 525, monitor 525 to monitor 520, monitor 520 to monitor 511, and monitor 511 to gateway 503.

In one embodiment of the invention, the mesh network may be configured according to the ZigBee protocol. In an alternate embodiment, the mesh network may be configured according to an ad-hoc Wi-Fi protocol, where efficient communication paths are determined and coordinated according to an ad-hoc on-demand distance vector (AODV) algorithm, as known by those of ordinary skill in the art.

Figure 6:
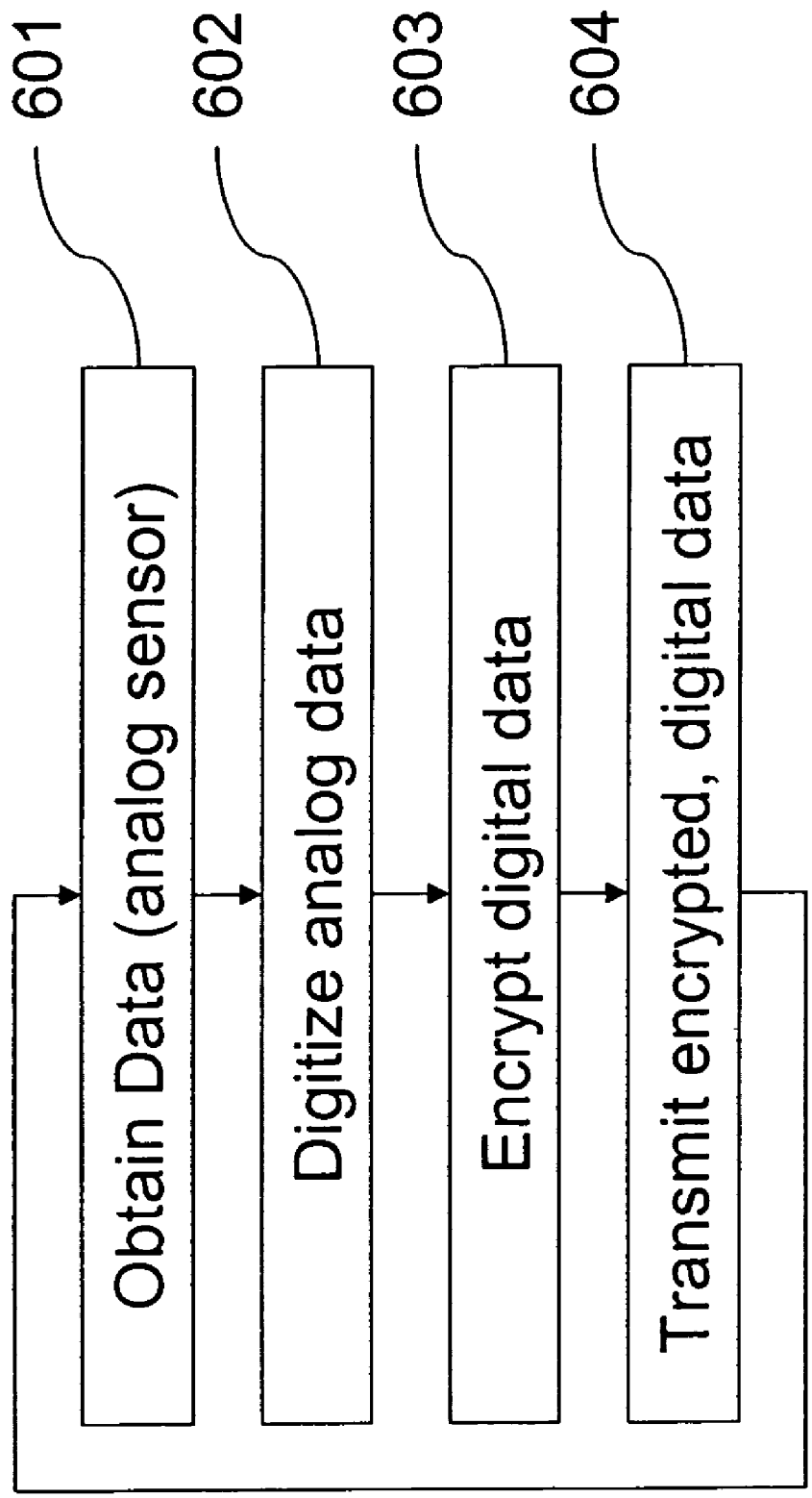
FIG. 6 is a flow-chart illustrating a method of monitoring an electrical asset, according to the present invention.

Referring now to FIG. 6, a flow-chart is shown for an exemplary process for monitoring an electrical asset in an electrical infrastructure. The process may be implemented by the exemplary electrical asset monitoring devices, described above, for example. As shown in FIG. 6, the process may begin with step 601 by obtaining data from an analog sensor (i.e., the monitoring element) corresponding to a current waveform, a voltage waveform, and/or a phase waveform of the electrical asset being monitored. Step 602 then digitizes the analog data (i.e., the sensed waveform(s)) into a digital signal. Optional step 603 may then encrypt the digital signal according to an encryption scheme, as described above. Step 604 may transmit the optionally encrypted digital signal through a mesh network, where the transmission is routed to a gateway based on a most efficient path. A further step (not shown in FIG. 6) may be performed in parallel with steps 601-604 and may include relaying, according to a most efficient path, other encrypted digital signals from other monitoring elements, where the other monitoring elements are monitoring other electrical assets. In a further embodiment, the process may also include the step of extracting and storing operational power from the electrical asset being monitored.

In yet a further embodiment, the process may also include the step of receiving a globally synchronized time for synching a local timer and a plurality of coordinates corresponding to a position of the monitoring element. Once the globally synchronized time is received, the process may then timestamp the sensed waveforms according to the local timer. In the present embodiment, the process may also encrypt the plurality of coordinates corresponding to the position of the monitoring element, and transmit the encrypted coordinates along with the time-stamped, encrypted waveform data. As described above, the device may alternatively or in addition transmit an identifier by which its position is known to the command center.

Figure 7:
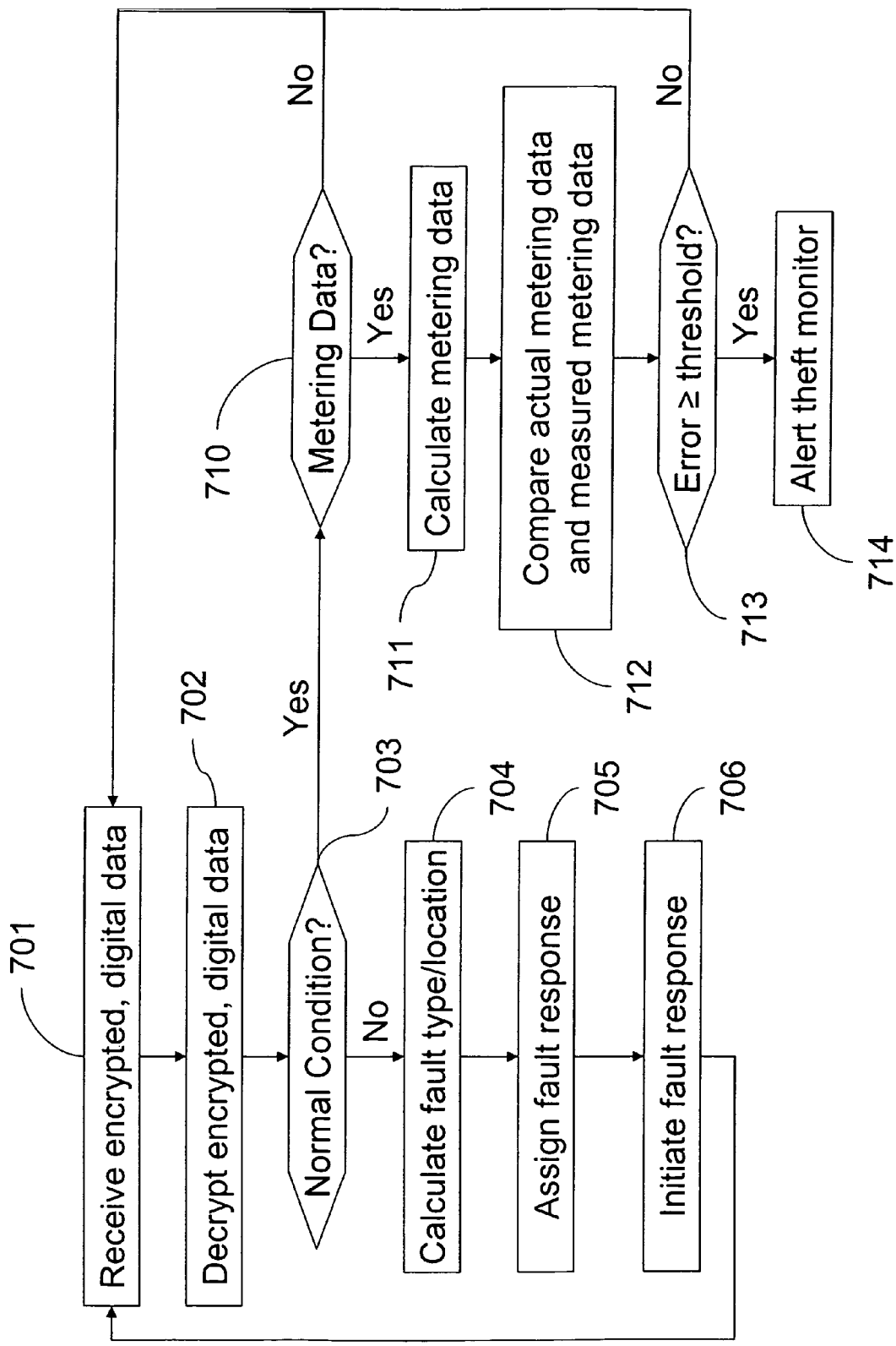
FIG. 7 is a flow-chart illustrating a method of managing an electrical asset monitoring system, according to the present invention.

FIG. 7 is a flow-chart illustrating a process according to yet another embodiment of the present invention. The process is for managing one or more electrical assets that define an electrical infrastructure, such as a power grid, for example. The process may begin with step 701, which receives, from one or more gateways, encrypted data corresponding to one or more of a current, a voltage, and/or a phase angle waveform sensed by a plurality of electrical asset monitors in the electrical infrastructure. Each one of the electrical asset monitors in the electrical infrastructure may be coupled to an electrical asset (e.g., a power line) to monitor an operating condition of the electrical asset. Step 702 may then decrypt the encrypted data to obtain the sensed waveform(s), where the waveforms are synchronized according to a globally synchronized timer and may further include a plurality of coordinates identifying a source location of each waveform. The coordinates may be GPS coordinates, for example or coordinates provided by a central database based on a received identifier. In one embodiment, the decryption may be performed according to the advanced encryption standard (AES). Step 703 may then determine, based on the plurality of sensed waveforms and respective source locations, operating conditions for each of the electrical assets being managed. The operating condition for an electrical asset may be compared to an expected value (i.e., an operating point, which may be obtained, for example, by taking a moving average of the operating condition of a given electrical asset) in order to determine whether the electrical asset is operating under a normal condition or an abnormal condition.

If, in step 702 an abnormal condition is detected, step 704 calculates a probable fault type and a probable fault location of a fault that may be causing the abnormal condition. The calculations may be performed based on the sensed waveform data and the source locations of any number of electrical asset monitors that sensed the abnormal condition, in addition to a database having a number of electrical asset parameters/characteristics. The electrical asset parameters database may include, for example, a propagation velocity of the electrical asset, which may be used to calculate the probable fault location as described above with reference to FIG. 4. The probable fault type may be determined by correlating the sensed waveform with a database of fault signatures, where a fault signature that has the highest correlation with the sensed waveform corresponds to the probable fault type. If multiple monitors detected the fault, then there may be multiple sensed waveforms that correspond to the fault and, accordingly, the probable fault type may be based on a weighted average of the correlations of each sensed waveform to the fault signature database, as described above.

Step 705 may then assign a fault response based on the probable fault type and the probable fault location. In one embodiment, step 705 may assign a fault warning for a momentary fault, a temporary fault, or an incipient fault. This may include, for example, generating a SOAP message having the probable fault type and probable fault location and transmitting the SOAP message according to a SOAP notification interface. In another embodiment of the invention, step 705 may assign a power factor correction algorithm when the probable fault type is an unbalance power factor fault. The power factor correction algorithm may include, for example, engaging any number of capacitor banks or other reactive elements. In yet another embodiment, step 705 may assign an electrical asset isolation algorithm when the probable fault type is an electrical asset failure fault. The isolation algorithm may include, for example, opening any number of switches around the electrical asset in order to isolate the fault from spreading throughout the electrical infrastructure. In yet another embodiment, step 705 may assign an electrical asset bypass algorithm when the probable fault type is an electrical asset overload fault. The bypass algorithm may include, for example, opening or closing any number of switches around the electrical asset, thereby allowing other electrical assets to pick up some portion of the load on the overloaded electrical asset. Alternately, any number of devices that may be causing the overload fault (e.g., factories, large office building climate control, etc.) may be controlled to lower the load (e.g., affecting the thermostat for a large office building).

If, in step 703, a normal operating condition of the electrical asset is detected, the process may either terminate (not shown in FIG. 7), restart at step 701 (not shown in FIG. 7), or move to step 710, which determines whether any measured metering data was received for the electrical asset. If metering data was not received, the process may either terminate (not shown in FIG. 7) or restart at step 701. If metering data was received, however, the process may proceed to step 711, which calculates, based on the sensed waveform data, actual metering data for an electric meter that originated the measured metering data. Though not shown in FIG. 7, the process may then determine, based on the actual metering data and/or the measured metering data, a time of use bill for each one of a number of electric meters. Alternately, step 712 may compare the calculated, actual metering data and the measured metering data to determine whether an error exists at any of the electric meters. Step 712 may also determine the magnitude of any determined error. Step 713 may determine whether the magnitude of the error is greater than some threshold. If it is not, the process may either terminate (not shown in FIG. 7) or restart at step 701. If the error is greater than the threshold, then step 714 may alert a theft monitor, which may then investigate the error, send a repair crew to fix the error, or generate a bill based on the actual metering data.

Although illustrated and described above with reference to certain specific embodiments, the present invention is nevertheless not intended to be limited to the details shown. Rather, various modifications may be made in the details within the scope and range of equivalents of the claims and without departing from the invention.

What is claimed is:

1. An apparatus for monitoring an electrical asset in an electrical infrastructure, the apparatus comprising:
    a sensor coupled to the electrical asset for obtaining data corresponding to at least one of a voltage, current, and phase angle waveforms;
    a globally synchronized timer for time-stamping the data with a globally synchronized time;
    a mesh network radio for communicating with at least one gateway and for relaying communications between one or more other electrical asset monitors and the at least one gateway;
    a processor for detecting one of a normal condition or an abnormal condition of the electrical asset based on the data; and
    a memory coupled to the processor for storing a plurality of fault type signatures;
    a power supply for extracting and storing energy from the electrical asset and supplying power to at least the sensor, the timer, and the radio,
    wherein the processor is configured to correlate the data to the plurality of fault type signatures to identify a fault type, and
    the mesh network radio is configured to transmit the fault type to the at least one gateway.

2. The apparatus of claim 1, wherein the processor is coupled to the globally synchronized timer for time-stamping the data and to the mesh network radio for transmitting the time-stamped data corresponding to the normal or abnormal condition.

3. The apparatus of claim 1, wherein the processor is configured for detecting a fault of the electrical asset based on the data and encrypting an indication of the fault according to a predetermined encryption scheme, wherein the processor is coupled to the globally synchronized timer for time-stamping the indication and to the mesh network radio for transmitting the encrypted, time-stamped indication.

4. The apparatus of claim 3, wherein the processor encrypts the fault type and the mesh network radio transmits the fault type to the at least one gateway.

5. The apparatus of claim 1, wherein the globally synchronized timer includes a global positioning system (GPS) receiver for receiving the globally synchronized time and a plurality of coordinates corresponding to a location of the apparatus.

6. The apparatus of claim 1, further comprising a memory for storing the time-stamped data.

7. The apparatus of claim 1, wherein the mesh network radio is one of a Zigbee radio, a Wi-Max radio or a Wi-Fi radio.

8. The apparatus of claim 1, wherein the sensor includes:
    at least one of a current transformer, a Rogowski coil, a Hall effect sensor, a potential transformer, a divider network, or an optoelectronic or fiber optic sensor including a Kerr cell, a Pockels cell, or a Faraday effect sensor, coupled to the electrical asset to provide a signal representing at least one of a voltage, a current or a phase;
    a conditioning circuit coupled to the sensor output for filtering high-frequency noise and scaling the measurement signal; and
    an analog-to-digital converter coupled to the conditioning circuit for digitizing the filtered current signal to provide at least a portion of the data.

9. The apparatus of claim 1, wherein the sensor includes at least one of a Hall effect sensor, a potential transformer, or an optoelectronic sensor.

10. The apparatus of claim 1, wherein the power supply includes:
    a current transformer coupled to extract energy from the electrical line;
    a voltage regulator coupled to the current transformer for maintaining a desired supply voltage; and
    a capacitor coupled to the current transformer and the voltage regulator for storing energy and delivering the stored energy to the apparatus during a power failure.

11. An apparatus for controlling electric assets comprising:
    an ad-hoc MESH radio configured for use with sensors and gateway,
    wherein the sensors coupled to the electric assets for obtaining data corresponding to at least one of a voltage, current, and phase angle waveforms
    a processor having analog and digital input and output ports wherein the input ports are configured to receive signal data from at least one electric asset via the sensors and the output ports are configured to control the at least one electrical asset, and
    a memory coupled to the processor for storing a plurality of fault type signatures
    wherein the processor is configured to correlate the signal data to the plurality of fault type signatures to identify a fault type.

* * * * *